United States Patent
Chang et al.

(10) Patent No.: US 10,061,673 B2
(45) Date of Patent: Aug. 28, 2018

(54) TESTING SYSTEM USING DIFFERENT OPERATING SYSTEMS TO TEST ELECTRONIC PRODUCTS

(71) Applicant: Primax Electronics Ltd., Taipei (TW)

(72) Inventors: Pei-Ming Chang, Taipei (TW); Shih-Chieh Hsu, Taipei (TW); Shi-Jie Zhang, Taipei (TW); Wei-Lung Huang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 197 days.

(21) Appl. No.: 15/292,586

(22) Filed: Oct. 13, 2016

(65) Prior Publication Data

US 2018/0032417 A1    Feb. 1, 2018

(30) Foreign Application Priority Data

Jul. 29, 2016 (TW) .............................. 105124105 A

(51) Int. Cl.
| | |
|---|---|
| *G06F 11/263* | (2006.01) |
| *G01R 31/319* | (2006.01) |
| *G01R 31/26* | (2014.01) |
| *G06F 11/273* | (2006.01) |
| *G01R 31/28* | (2006.01) |

(Continued)

(52) U.S. Cl.
CPC ............ *G06F 11/263* (2013.01); *G01R 31/26* (2013.01); *G01R 31/28* (2013.01); *G01R 31/2806* (2013.01); *G01R 31/2851* (2013.01); *G01R 31/319* (2013.01); *G01R 31/31903* (2013.01); *G06F 11/273* (2013.01); *G06F 11/2733* (2013.01); *G06F 9/4408* (2013.01); *G06F 13/362* (2013.01); *Y02P 90/30* (2015.11)

(58) Field of Classification Search
CPC .. G06F 11/273; G06F 11/2733; G06F 11/263; G06F 9/4408; G06F 13/362; G01R 31/319; G01R 31/31903
See application file for complete search history.

(56) References Cited

U.S. PATENT DOCUMENTS

| | | | |
|---|---|---|---|
| 4,760,330 A * | 7/1988 | Lias, Jr. ........... | G01R 31/31907 714/32 |
| 7,363,188 B1 * | 4/2008 | Olgaard ........... | G01R 31/31707 702/118 |

(Continued)

*Primary Examiner* — Paul Contino
(74) *Attorney, Agent, or Firm* — Muncy, Geissler, Olds & Lowe, P.C.

(57) ABSTRACT

A testing system uses different operating systems to test electronic products. The testing system includes a master computer, a slave computer and a relay. A first operating system is installed in the master computer. A second operating system is installed in the slave computer. The master computer and the slave computer are connected with each other through RS-232 ports. The relay is connected with the master computer, the slave computer and an under-test product. By changing the voltage level state of specified pins of the RS-232 ports, the master computer notifies the slave computer to test the under-test product. Moreover, by controlling the relay, the connection between the master computer and the under-test product is switched to the connection between the slave computer and the under-test product. Consequently, the under-test product is tested by the slave computer.

9 Claims, 2 Drawing Sheets

(51) Int. Cl.
*G06F 9/4401* (2018.01)
*G06F 13/362* (2006.01)

(56) References Cited

U.S. PATENT DOCUMENTS

| | | | |
|---|---|---|---|
| 9,158,662 B1* | 10/2015 | Hanes | G06F 11/3664 |
| 2007/0245199 A1* | 10/2007 | Pochowski | G06F 11/263 |
| | | | 714/742 |
| 2009/0235249 A1* | 9/2009 | Kobayashi | G06F 11/1497 |
| | | | 718/1 |
| 2010/0213950 A1* | 8/2010 | Liu | G01R 31/2834 |
| | | | 324/537 |
| 2014/0256373 A1* | 9/2014 | Hernandez | H04B 17/12 |
| | | | 455/509 |
| 2015/0316614 A1* | 11/2015 | Petrov | G01R 31/2834 |
| | | | 702/108 |
| 2017/0126539 A1* | 5/2017 | Tiwari | H04L 43/50 |
| 2017/0228301 A1* | 8/2017 | Schinzel | G06F 11/2733 |

* cited by examiner

TESTING SYSTEM USING DIFFERENT OPERATING SYSTEMS TO TEST ELECTRONIC PRODUCTS

FIELD OF THE INVENTION

The present invention relates to a testing system for testing electronic products, and more particularly to a testing system using different operating systems to test electronic products.

BACKGROUND OF THE INVENTION

In the fabricating process of a computer peripheral device, different operating systems are possibly used to test the products. For example, a Microsoft Windows operating system is used to update the firmware of the product, and an Apple Mac operating system is used to test other items.

These two different operating systems are installed in different computers. Conventionally, a USB switch is connected between the under-test product and two computers by the testing worker. Firstly, the USB switch is connected with a first computer of the two computers. Then, the testing worker visually judges whether the testing process is ended according to the testing procedures shown on a display screen of the first computer. After the testing process is ended, the product is connected with a second computer of the two computers through the USB switch. Then, the product is tested by the second computer.

In the conventional testing system, the timing of connecting the under-test product with the second computer to perform the subsequent testing process of is manually judged according to the testing progress. Moreover, the way of manually switching the USB switch to perform the testing process needs high labor cost and reduces the testing speed.

SUMMARY OF THE INVENTION

The present invention provides a testing system for testing electronic device at increased testing speed.

In accordance with an aspect of the present invention, there is provided a testing system using different operating systems to test electronic products. The testing system includes a first operating system and a second operating system different from the first operating system. The testing system includes a master computer, a slave computer and a switch device. The master computer includes a first switch connecting port and a first data connecting port. The first operating system is installed in the master computer. The slave computer includes a second switch connecting port and a second data connecting port. The second operating system is installed in the slave computer. The first switch connecting port and the second switch connecting port are connected with each other. The switch device is connected with the first switch connecting port of the master computer, the first data connecting port of the master computer, the second data connecting port of the slave computer and an under-test product. After the first data connecting port of the master computer is electrically connected with the under-test product through the switch device, the under-test product is tested by the master computer. After the under-test product is tested by the master computer, the master computer issues a first notification signal from the first switch connecting port and issues a first switching signal from the first switch connecting port to the switch device. In response to the first switching signal, an electric connection between the second data connecting port of the slave computer and the under-test product is established. After the second switch connecting port of the slave computer detects the first notification signal, the slave computer tests the under-test product.

In an embodiment, the switch device is a relay. The relay includes two normally closed terminals, two normally open terminals and two common terminals. The two normally closed terminals are connected with the first data connecting port of the master computer. The two normally open terminals are connected with the second data connecting port of the slave computer. The two common terminals are connected with the under-test product. Moreover, the relay further includes a driving circuit.

In an embodiment, the first switch connecting port and the second switch connecting port are RS-232 ports. A sixth pin of the first switch connecting port is connected with a fourth pin of the second switch connecting port. A fourth pin of the first switch connecting port is connected with a sixth pin of the second switch connecting port. A seventh pin of the first switch connecting port is connected with the driving circuit of the relay. After the under-test product is tested by the master computer, the fourth pin of the first switch connecting port is changed to a high voltage level state to result in the first notification signal by the master computer, and the seventh pin of the first switch connecting port is changed to a high voltage level state to result in the switching signal by the master computer. After the under-test product is tested by the slave computer, the slave computer issues a second notification signal from the second switch connecting port. After the second notification signal is detected by the master computer, the electric connection between the slave computer and the under-test product is interrupted by the master computer. When the fourth pin of the second switch connecting port is changed to a high voltage level state, the second notification signal is generated. After the master computer detects the high voltage level state through the sixth pin of the first switch connecting port, the seventh pin of the first switch connecting port is changed to a low voltage level state by the master computer. In response to the low voltage level state of the seventh pin of the first switch connecting port, the two normally closed terminals of the relay are connected with the two common terminals of the relay, and the electric connection between the slave computer and the under-test product is interrupted.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
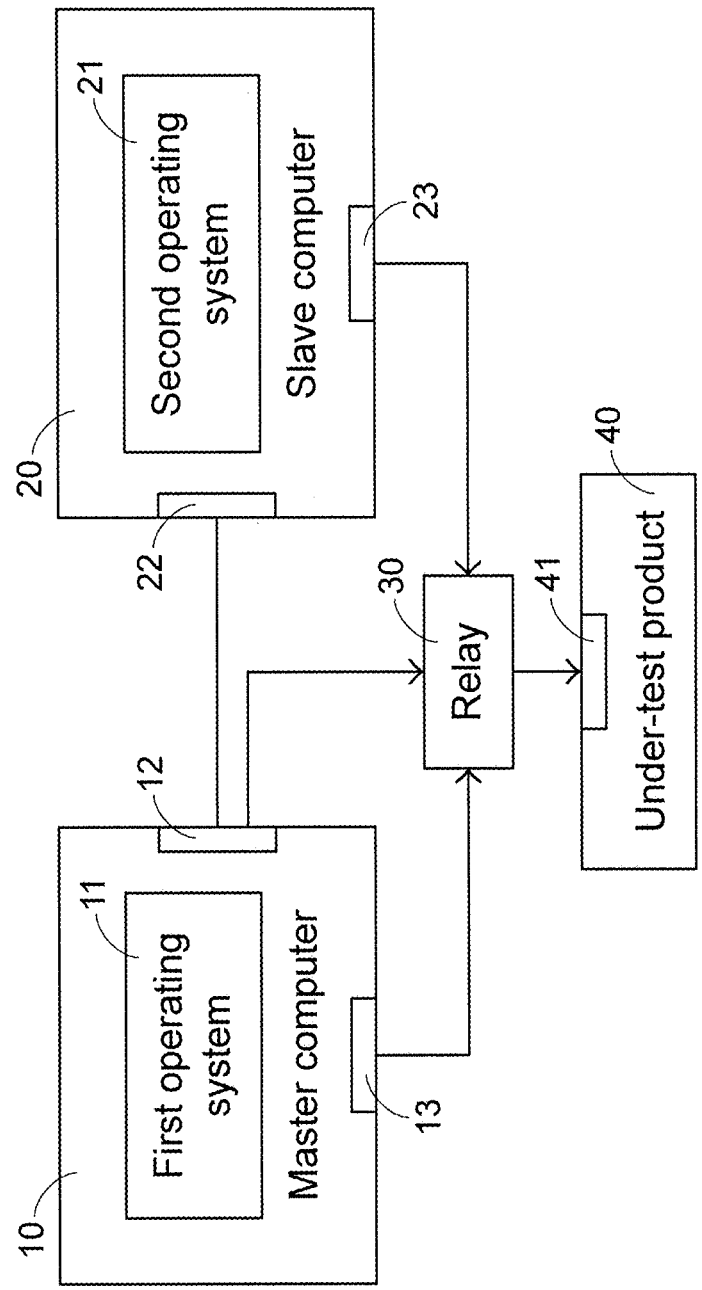
FIG. 1 is a schematic functional block diagram illustrating a testing system according to an embodiment of the present invention.

FIG. 1 is a schematic functional block diagram illustrating a testing system according to an embodiment of the present invention. As shown in FIG. 1, the testing system 100 comprises a master computer 10, a slave computer 20 and a switch device 30. In an embodiment, the switch device 30 is a relay. A first operating system 11 is installed in the master computer 10. A second operating system 21 is installed in the slave computer 20. The master computer 10 comprises a first switch connecting port 12 and a first data connecting port 13. The slave computer 20 comprises a second switch connecting port 22 and a second data connecting port 23. The relay 30 is connected with the first switch connecting port 12 and the first data connecting port 13 of the master computer 10, the second data connecting port 23 of the slave computer 20 and a communication interface 41 of an under-test product 40. For example, the communication interface 41 is a USB port. Moreover, the first switch connecting port 12 of the master computer 10 and the second switch connecting port 22 of the slave computer 20 are connected with each other.

In an embodiment, both of the first switch connecting port 12 and the second switch connecting port 22 are RS-232 ports, and both of the first data connecting port 13 and the second data connecting port 23 are USB ports.

Figure 2:
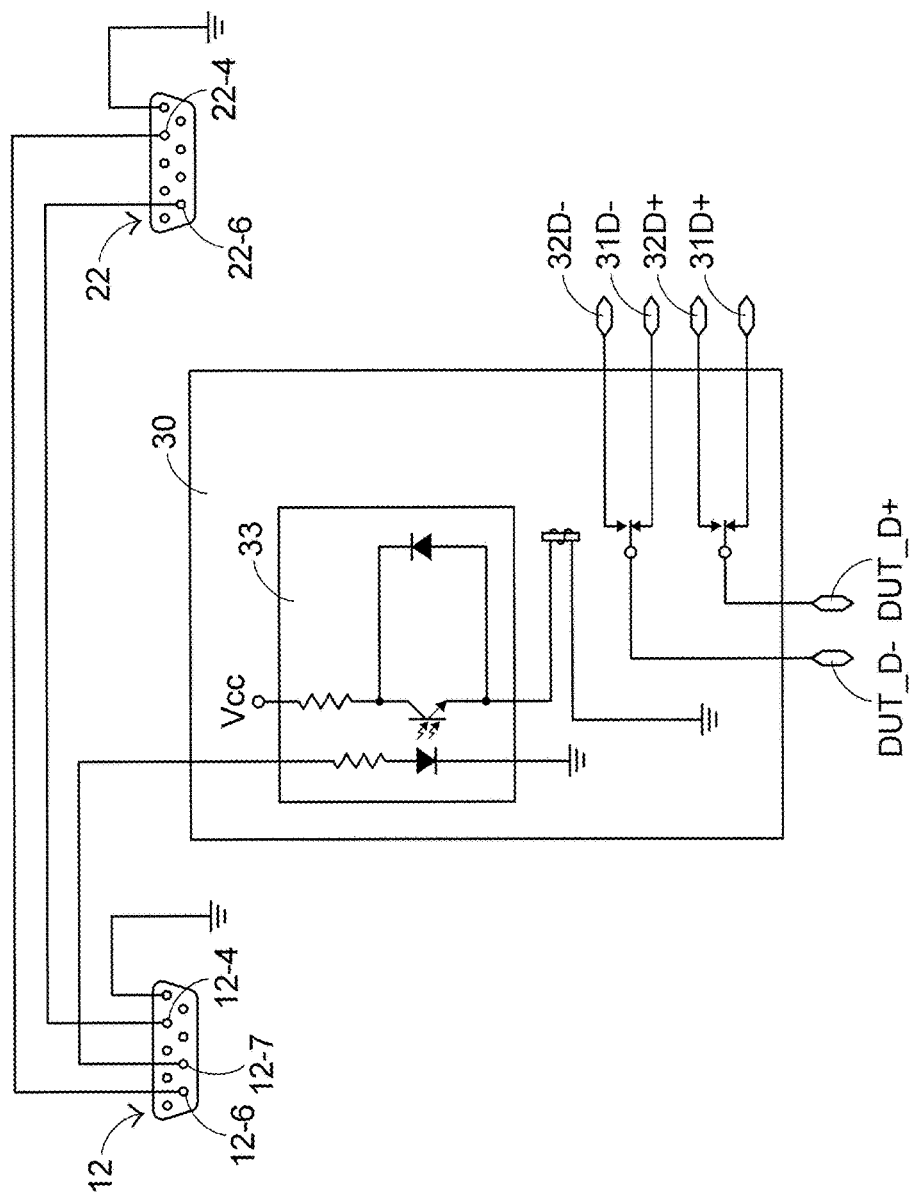
FIG. 2 is a circuit diagram illustrating the relationships between the relay, the RS-232 port of the master computer and the RS-232 port of the slave computer of the testing system according to the embodiment of the present invention.

FIG. 2 is a circuit diagram illustrating the relationships between the relay, the RS-232 port of the master computer and the RS-232 port of the slave computer of the testing system according to the embodiment of the present invention. In this embodiment, the RS-232 port comprises nine pins. The sixth pin 12-6 of the RS-232 port 12 of the master computer 10 is connected with the fourth pin 22-4 of the RS-232 port of the slave computer 20 through a connecting wire for example. Moreover, the fourth pin 12-4 of the RS-232 port 12 is connected with the sixth pin 22-6 of the RS-232 port 22. The other pins of the RS-232 port 12 and the other pins of the RS-232 port 22 are not connected with each other.

In an embodiment, the relay 30 is a double-pole-double-throw relay. That is, the relay 30 comprises two common terminals DUT−, DUT+, two normally closed terminals 31D+, 31D−, and two normally open terminals 32D+, 32D−. The relay 30 further comprises a driving circuit 33. In this embodiment, the driving circuit 33 is an optical coupler circuit. In another embodiment, the driving circuit is a Darlington IC circuit. In case that the state of the relay 30 is not changed, the normally open terminals 32D+ and 32D− are connected with the common terminals DUT− and DUT+.

The two normally closed terminals 31D+ and 31D− of the relay 30 are connected with the first data connecting port 13 of the master computer 10. The two normally open terminals 32D+ and 32D− of the relay 30 are connected with the second data connecting port 23 of the slave computer 20. The two common terminals DUT+ and DUT− of the relay 30 are connected with the USB port 41 of the under-test product 40.

The operations of the testing system of the present invention will be illustrated as follows. The master computer 10 and the slave computer 20 comprise respective application programs to execute associated control mechanisms. In this testing system, the master computer 10 is the computer that performs the testing process at first, and the slave computer 20 is the other computer. In an initial state, the master computer 10 is connected with the two normally closed terminals 31D+ and 31D− of the relay 30. That is, the master computer 10 is electrically connected with the under-test product 40. Meanwhile, the master computer 10 can test the under-test product 40. After the under-test product 40 is tested by the master computer 10, the master computer 10 issues a first notification signal to the slave computer 20. For example, when the fourth pin 12-4 of the RS-232 port 12 of the master computer 10 is changed to a high voltage level state and the high voltage level state is maintained for a specified time period (e.g., 1000 ms), the first notification signal is generated. At the same time, the master computer 10 issues a first switching signal to the relay 30. For example, when the seventh pin 12-7 of the RS-232 port 12 of the master computer 10 is changed to a high voltage level state, the first switching signal is generated. After the first switching signal in the high voltage level state is transmitted to the driving circuit 33 of the relay 30, the driving circuit 33 is magnetized. Consequently, the common terminals DUT+ and DUT− of the relay 30 are connected with the normally open terminals 32D+ and 32D−. Meanwhile, the connection between the master computer 10 and the under-test product 40 is interrupted, and the connection between the slave computer 20 and the under-test product 40 is established. Since the sixth pin 22-6 of the RS-232 port 22 of the slave computer 20 is connected with the fourth pin 12-4 of the RS-232 port 12 of the master computer 10, the slave computer 20 detects the high voltage level state of the fourth pin 12-4 of the RS-232 port 12. According to the high voltage level state of the fourth pin 12-4 of the RS-232 port 12, the slave computer 20 realizes that the connection between the master computer 10 and the under-test product 40 is switched to the connection between the slave computer 20 and the under-test product 40. Then, the under-test product 40 is tested by the slave computer 20.

After the under-test product 40 is tested by the slave computer 20, the slave computer 20 issues a second notification signal to the master computer 10. For example, when the fourth pin 22-4 of the RS-232 port 22 of the master computer 10 is changed to a high voltage level state, the second notification signal is generated. Since the sixth pin 12-6 of the RS-232 port 12 of the master computer 10 is connected with the fourth pin 22-4 of the RS-232 port of the slave computer 20, the master computer 10 detects the high voltage level state of the sixth pin 12-6 of the RS-232 port 12. Consequently, the master computer 10 realizes that the under-test product 40 has been tested by the slave computer 20. Then, the seventh pin 12-7 of the RS-232 port 12 is changed to a low voltage level state by the master computer 10. Consequently, the relay 30 is no longer magnetized. Meanwhile, the two normally closed terminals 31D+ and 31D− of the relay 30 are connected with the common terminals DUT+ and DUT− of the relay 30 again. Meanwhile, the connection between the slave computer 20 and the under-test product 40 is interrupted by the master computer 10, and the electric connection between the master computer 10 and the under-test product 40 is established again.

From the above descriptions, the present invention provides a testing system. The testing system uses cost-effective RS-232 ports. According to the existing pin definitions, the corresponding pins of the RS-232 ports of the master computer and the slave computer are connected with each other. Consequently, the master computer and the slave computer are in communication with each other automatically. Moreover, a specified pin of the RS-232 port of the master computer 10 is connected with the relay 30. By simply changing the high/low voltage level states of the associated pins, the electric connection between the master computer 10 and the under-test product 40 is switched to the electric connection between the slave computer 20 and the under-test product 40. Since the computer to execute the testing process is automatically connected with the under-test product, the problem of the manual switching action eliminated. Consequently, the testing speed is enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A testing system using different operating systems to test electronic products, the testing system comprising a first operating system and a second operating system different from the first operating system, the testing system comprising:
   a master computer comprising a first switch connecting port and a first data connecting port, wherein the first operating system is installed in the master computer;
   a slave computer comprising a second switch connecting port and a second data connecting port, wherein the second operating system is installed in the slave computer, and the first switch connecting port and the second switch connecting port are connected with each other; and
   a switch device connected with the first switch connecting port of the master computer, the first data connecting port of the master computer, the second data connecting port of the slave computer and an under-test product, wherein after the first data connecting port of the master computer is electrically connected with the under-test product through the switch device, the under-test product is tested by the master computer, wherein after the under-test product is tested by the master computer, the master computer issues a first notification signal from the first switch connecting port and issues a first switching signal from the first switch connecting port to the switch device, wherein in response to the first switching signal, an electric connection between the second data connecting port of the slave computer and the under-test product is established, wherein after the second switch connecting port of the slave computer detects the first notification signal, the slave computer tests the under-test product.

2. The testing system according to claim 1, wherein the switch device is a relay.

3. The testing system according to claim 2, wherein the relay comprises two normally closed terminals, two normally open terminals and two common terminals, wherein the two normally closed terminals are connected with the first data connecting port of the master computer, the two normally open terminals are connected with the second data connecting port of the slave computer, and the two common terminals are connected with the under-test product.

4. The testing system according to claim 3, wherein the relay further comprises a driving circuit.

5. The testing system according to claim 4, wherein the first switch connecting port and the second switch connecting port are RS-232 ports.

6. The testing system according to claim 5, wherein a sixth pin of the first switch connecting port is connected with a fourth pin of the second switch connecting port, a fourth pin of the first switch connecting port is connected with a sixth pin of the second switch connecting port, and a seventh pin of the first switch connecting port is connected with the driving circuit of the relay.

7. The testing system according to claim 6, wherein after the under-test product is tested by the master computer, the fourth pin of the first switch connecting port is changed to a high voltage level state to result in the first notification signal by the master computer, and the seventh pin of the first switch connecting port is changed to a high voltage level state to result in the switching signal by the master computer.

8. The testing system according to claim 6, wherein after the under-test product is tested by the slave computer, the slave computer issues a second notification signal from the second switch connecting port, wherein after the second notification signal is detected by the master computer, the electric connection between the slave computer and the under-test product is interrupted by the master computer.

9. The testing system according to claim 8, wherein when the fourth pin of the second switch connecting port is changed to a high voltage level state, the second notification signal is generated, wherein after the master computer detects the high voltage level state through the sixth pin of the first switch connecting port, the seventh pin of the first switch connecting port is changed to a low voltage level state by the master computer, wherein in response to the low voltage level state of the seventh pin of the first switch connecting port, the two normally closed terminals of the relay are connected with the two common terminals of the relay, and the electric connection between the slave computer and the under-test product is interrupted.

* * * * *